(12) United States Patent
Wu et al.

(10) Patent No.: US 7,298,191 B2
(45) Date of Patent: Nov. 20, 2007

(54) RESET-FREE DELAY-LOCKED LOOP

(75) Inventors: Hai Jie Wu, Singapore (SG); Kiat How Tan, Singapore (SG); Chin Yeong Koh, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/353,790

(22) Filed: Feb. 14, 2006

(65) Prior Publication Data

US 2006/0132205 A1  Jun. 22, 2006

Related U.S. Application Data

(63) Continuation of application No. PCT/SG03/00213, filed on Sep. 8, 2003.

(51) Int. Cl.
*H03L 7/06* (2006.01)

(52) U.S. Cl. .................................. 327/158; 327/156
(58) Field of Classification Search ................ 327/158, 327/156; 386/88
See application file for complete search history.

(56) References Cited

U.S. PATENT DOCUMENTS

| | | | |
|---|---|---|---|
| 4,503,536 A | 3/1985 | Panzer | |
| 4,539,602 A * | 9/1985 | Okano ........................ | 386/88 |
| 4,542,354 A | 9/1985 | Robinton et al. | |
| 4,805,192 A | 2/1989 | Confalonieri et al. | |
| 4,974,184 A | 11/1990 | Avra | |
| 5,072,195 A | 12/1991 | Graham et al. | |
| 5,202,978 A | 4/1993 | Nozuyama | |
| 5,223,755 A | 6/1993 | Richley | |
| 5,329,252 A | 7/1994 | Major | |
| 5,561,660 A | 10/1996 | Kotowski et al. | |
| 5,572,099 A | 11/1996 | Carobolante | |
| 5,663,665 A | 9/1997 | Wang et al. | |
| 5,721,547 A | 2/1998 | Longo | |
| 5,854,575 A | 12/1998 | Fiedler et al. | |
| 5,936,900 A | 8/1999 | Hii et al. | |
| 5,994,934 A | 11/1999 | Yoshimura et al. | |
| 6,239,634 B1 * | 5/2001 | McDonagh .................. | 327/158 |
| 6,437,616 B1 | 8/2002 | Antone et al. | |
| 6,633,190 B1 | 10/2003 | Alvandpour et al. | |
| 6,822,484 B1 | 11/2004 | Boerstler | |
| 2003/0076142 A1 * | 4/2003 | Ko ............................. | 327/158 |

OTHER PUBLICATIONS

Lee, T.H., et al., "A 155-MHz Clock Recovery Delay- and Phase-Locked Loop," IEEE Journal of Solid-State Circuits, vol. 27, No. 12, Dec. 1992, pp. 1736-1746.

(Continued)

*Primary Examiner*—Linh My Nguyen
*Assistant Examiner*—Diana J Cheng
(74) *Attorney, Agent, or Firm*—Slater & Matsil, L.L.P.

(57) ABSTRACT

A delay locked loop (DLL) includes a delay unit configured to delay an input clock signal by a specified amount to produce a delayed clock signal. A phase detector receives as input the input clock signal and the delayed clock signal and outputs a signal proportional to the phase difference between the input clock signal and the delayed clock signal to provide a control voltage for adjusting the delay to the specified amount. A pulse swallower removes a pulse from the input clock signal or from the delayed clock signal to reverse the direction of the control signal.

20 Claims, 4 Drawing Sheets

OTHER PUBLICATIONS

Co, R.S., et al., "Optimization of Phase-Locked Loop Performance in Data Recovery Systems," IEEE Journal of Solid-State Circuits, vol. 29, No. 9, Sep. 1994, pp. 1022-1034.

Maneatis, J.G., "Low-Jitter Process-Independent DLL and PLL Based on Self-Biased Techniques," IEEE Journal of Solid-State Circuits, vol. 31, No. 11, Nov. 1996, pp. 1723-1732.

* cited by examiner

PRIOR ART

PRIOR ART

RESET-FREE DELAY-LOCKED LOOP

This application is a continuation of co-pending International Application No. PCT/SG2003/000213, filed Sep. 8, 2003, which designated the United States and was published in English, which application is incorporated herein by reference.

TECHNICAL FIELD

The invention relates to the field of clock generation and more particularly to delay-locked loops for clock generation.

BACKGROUND

FIG. 1 shows a delay-locked loop (DLL) 101 of the prior art (see U.S. Pat. No. 6,239,634 to McDonagh, for example). The DLL 101 comprises a phase frequency detector (PFD) 103, a charge pump 105, a loop filter (loop capacitor) 107 and a voltage controlled delay line (VCDL) 109. The VCDL 109 can include n stages, each stage contributing a certain amount of delay to the overall delay. The DLL 101 receives a reference clock signal (input clock signal) 111 and generates an output clock signal 113 that has its phase delayed by a fraction of a period of the reference clock signal 111.

The PFD 103 receives, on its input terminals, the reference clock signal 111 and the output clock signal 113. In a conventional arrangement, the PFD 103 is a rising edge detector that compares the rising edges of the two clock signals. Based on this comparison, the PFD 103 generates one of three states. If the phases of the two signals differ by the desired amount, then the loop is "locked". Neither the UP nor the DOWN signal is asserted and the delay of the VCDL remains the same. If the reference clock signal 111 leads the output clock signal 113 by more than the desired amount, then the delay of the DLL 101 is too much. If the reference clock signal 111 lags the output clock signal 113 by more than the desired amount, then the delay of the DLL 101 is too little. The detector 103 then outputs an UP or a DOWN signal (depending on the particular circuit design) proportional to the phase difference between the reference clock signal 111 and the output clock signal 113. The UP and DOWN signals typically take the form of pulses having a width or duration corresponding to the timing difference between the rising edges of the reference and output clock signals. The UP and DOWN signals are output to the charge pump 105 through two separate lines.

The charge pump 105 generates a current Icp 115 that controls the voltage of the loop filter 107 and thereby the delay of the VCDL 109. The current 115 is dependent on the signal output by the PFD 103. If the charge pump 105 receives an UP signal from the PFD 103, Icp 115 is increased. If the charge pump 105 receives a DOWN signal from the PFD 103, Icp 115 is decreased. If neither an UP nor a DOWN signal is received, indicating that the clock signals have the desired phase difference, the charge pump 105 does not adjust Icp 115.

The loop filter 107 is positioned between the charge pump 105 and the VCDL 109. An UP signal from the PFD 103 results in an increase of the voltage Vloop 117 on the loop filter 107, while a DOWN signal from the PFD 103 results in a decrease of the voltage Vloop 117 on the loop filter 107. Vloop 117 is applied to the VCDL 109. The VCDL 109 can be comprised of a voltage-to-current converter, which then supplies a current to a current controlled delay line to control the delay. The loop filter 107 also removes out-of-band, interfering signals before application of Vloop 117 to the VCDL 109. A common configuration for the loop filter 107 in the DLL 101 is a simple single-pole, low-pass filter that can be realized with a single capacitor.

The output clock signal 113 is looped back to the PFD 103 to facilitate the delay-locked loop operation. The DLL 101 thus compares the reference clock signal 111 phase to the output clock signal 113 phase and adjusts the detected phase difference between the two to a desired amount by adjusting the delay of the VCDL 109.

The prior-art DLL 101 faces lock problems. In order to prevent a false lock to a zero or incorrect phase, the initial state of the DLL 101 must be well defined so that the leading edge of the output clock signal 113 is delayed between ½ a period and 1½ periods. Additionally, a reset signal must be applied if the input frequency is changed.

FIG. 4 illustrates the lock-to-zero problem of the prior art. As can be seen, the fed-back output clock signal 113 has a phase, which is delayed by a small amount relative to the reference clock signal 111. The PFD 103 outputs an up signal 403 to the charge pump 105, increasing the voltage Vloop 117 in order to decrease the delay of the fed-back output clock signal 113. However, the Vloop 117 cannot increase enough and the DLL 201 becomes stuck, or locked-to-zero trying to achieve the zero phase delay.

FIG. 6 illustrates the false locking of the prior-art DLL. Due to the false locking, the reference clock signal 111 has a phase, which is delayed relative to fed-back output clock signal 113. The PFD 103 outputs a down signal 503 to the charge pump 105, decreasing the voltage Vloop 117 in order to increase the delay of the fed-back output clock signal 113.

McDonagh provides a circuit providing correct start-up and locking of the DLL circuit, but still requires that the DLL be biased to the smallest delay value. If the reference clock signal frequency is changed, then the DLL needs to be reset.

It would be desirable to have a DLL that would, without being reset, achieve correct startup and lock to the correct phase even if the reference clock signal frequency is changed.

SUMMARY OF THE INVENTION

The present invention provides a DLL that does not require reset to achieve correct startup and that locks to the correct phase even when the reference frequency is changed. The present invention achieves these features by setting the boundaries at both sides of the VCDL, and by using a pulse swallow technique to reverse the direction of the PFD.

In a preferred embodiment, the invention is for a delay locked loop (DLL) including a delay unit configured to delay an input clock signal by a specified amount to produce a delayed clock signal. A phase detector receives as input the input clock signal and the delayed clock signal and outputs a signal proportional to the phase difference between the input clock signal and the delayed clock signal to provide a control voltage for adjusting the delay to the specified amount. A pulse swallower removes a pulse from the input clock signal or from the delayed clock signal to reverse the direction of the control signal.

BRIEF DESCRIPTION OF THE DRAWINGS

Further preferred features of the invention will now be described for the sake of example only with reference to the following figures, in which.

DETAILED DESCRIPTION OF ILLUSTRATIVE EMBODIMENTS

Figure 1:
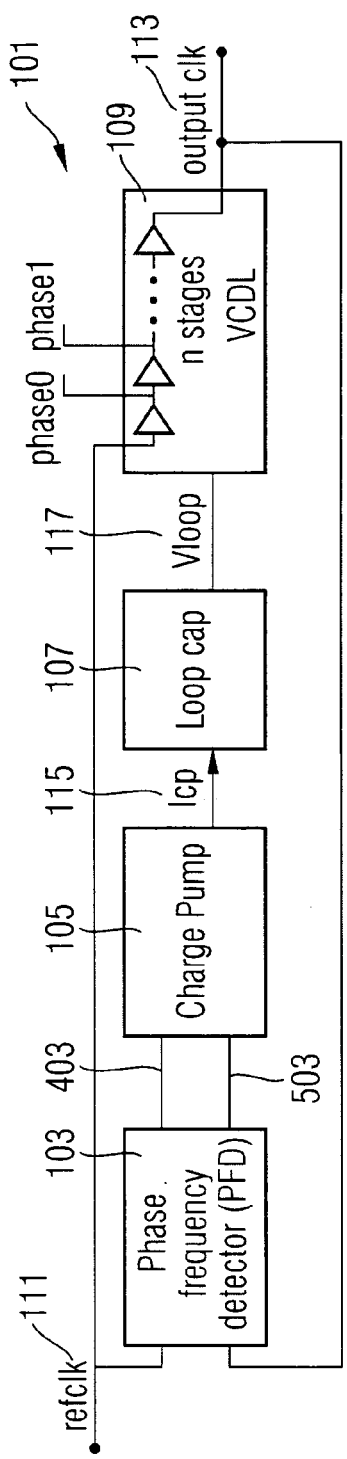
FIG. 1 shows a delay-locked loop (DLL) of the prior art.
Figure 2:
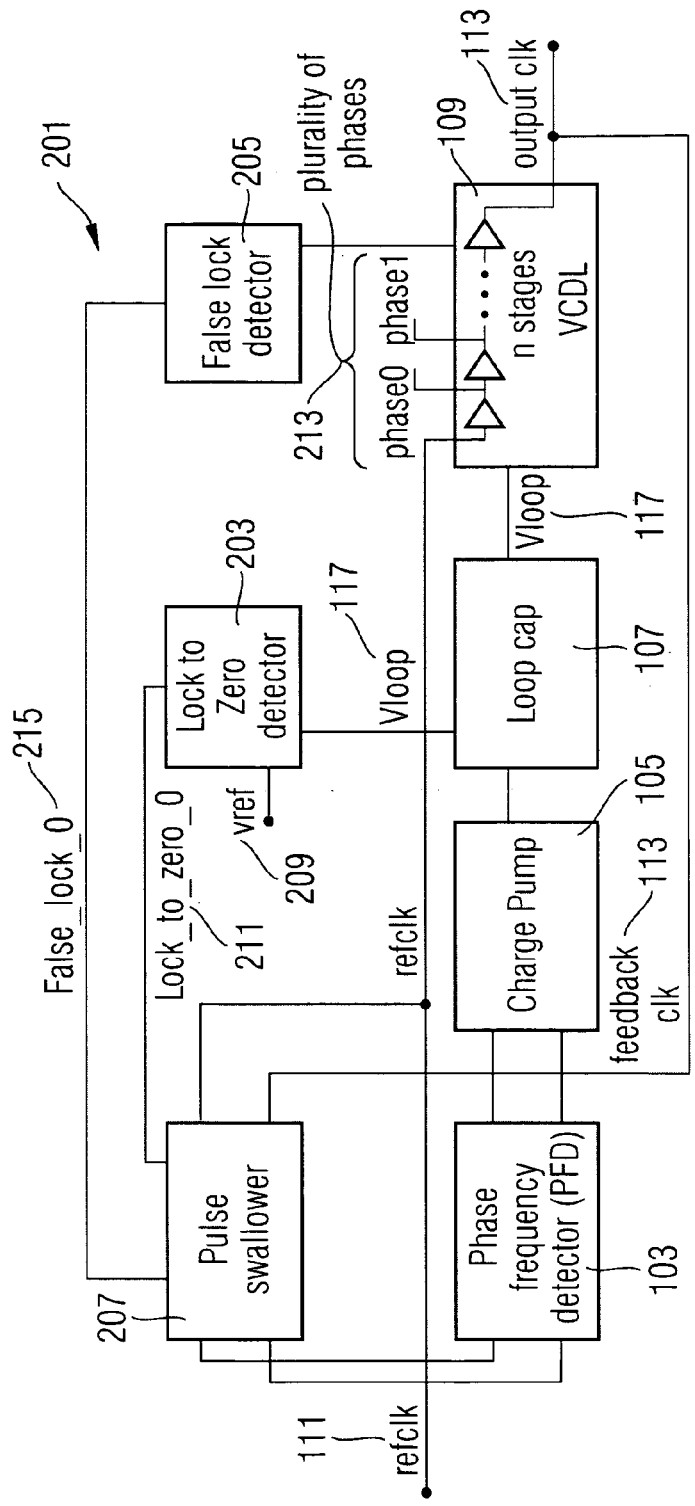
FIG. 2 shows a DLL of the present invention for preventing lock to zero error and false locking.

A DLL 201 of the present invention is shown in FIG. 2. The prior art DLL 101 of FIG. 1 is modified by adding three additional circuit blocks. These blocks are a lock to zero detector 203, a false lock detector 205 and a pulse swallower 207.

In the examples, it is assumed that increasing the voltage Vloop 117 decreases the delay of the VCDL 109 and decreasing the voltage Vloop 117 increases the delay of the VCDL 109. However, when other circuits are used for the VCDL the opposite can be true.

The lock to zero detector 203 detects "lock to zero" error. In the prior-art circuit 101 of the FIG. 1, the "lock to zero" error can occur if the delay of the output clock signal 113 is less than ½ period ($\pi$ radians) relative to the reference clock signal 111 when the PFD 103 first detects the reference clock signal 111, following reset. In this case, the DLL 101 will keep decreasing the delay of the VCDL 109 in order to achieve lock, and the DLL 101 will attempt to lock to zero delay. This is not possible to achieve since it is impossible to have no delay in a circuit, so the DLL 101 will not be able to lock (thus the "lock to zero" error).

Figure 3:
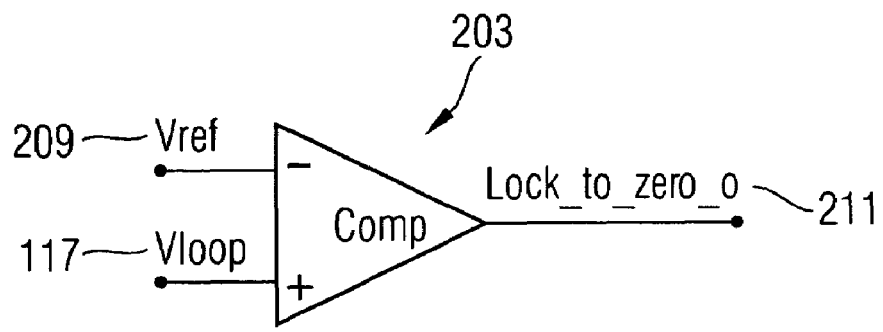
FIG. 3 illustrates how the lock to zero detector illustrated in FIG. 2 functions as a comparator.
Figure 4:
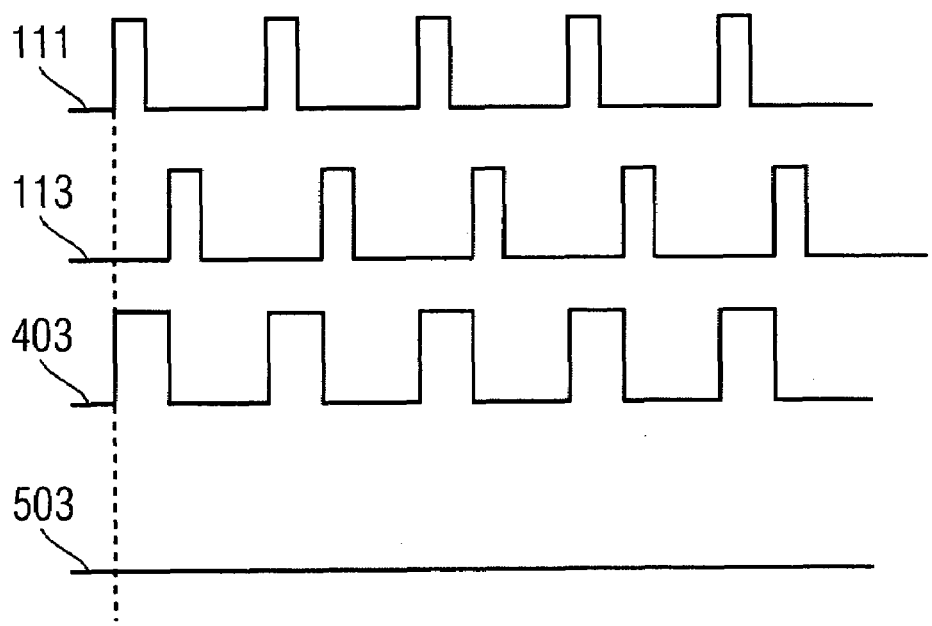
FIG. 4 illustrates the prior-art lock-to-zero problem of the DLL of FIG. 1.

The lock to zero detector 203 functions as a comparator (see FIG. 3). It compares Vloop 117 to a reference voltage Vref 209. If Vloop>Vref then a lock_to_zero_o signal (active High) 211 is generated, which is sent to the pulse swallower 207.

The false lock detector 205 prevents the DLL 201 from locking to the wrong phase (e.g., $4\pi$, $6\pi$, etc.). False locking of the DLL 101 of FIG. 1 can occur if the delay in the VCDL 109 is too great. The false lock detector 205 uses the plurality of phases 213 from the VCDL 109 to determine whether the DLL 101 is locked to a false phase. If such a false lock occurs, a false_lock_o signal 215 is generated and sent to the pulse swallower 207.

The pulse swallower 207 functions to remove a pulse from the reference clock signal 111, if the lock_to_zero_o signal 211 goes to high (indicating that Vloop 117 has increased too much). By doing so, the direction of the PFD 103 output is reversed from an up signal to a down signal to decrease the delay of the VCDL 109.

Figure 5:
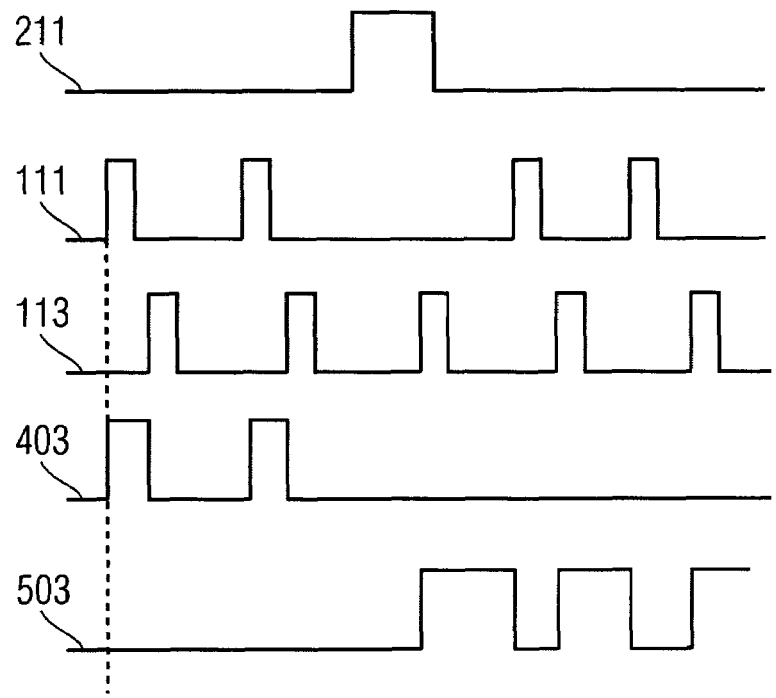
FIG. 5 illustrates the lock-to-zero problem solved by the invention of FIG. 2.
Figure 6:
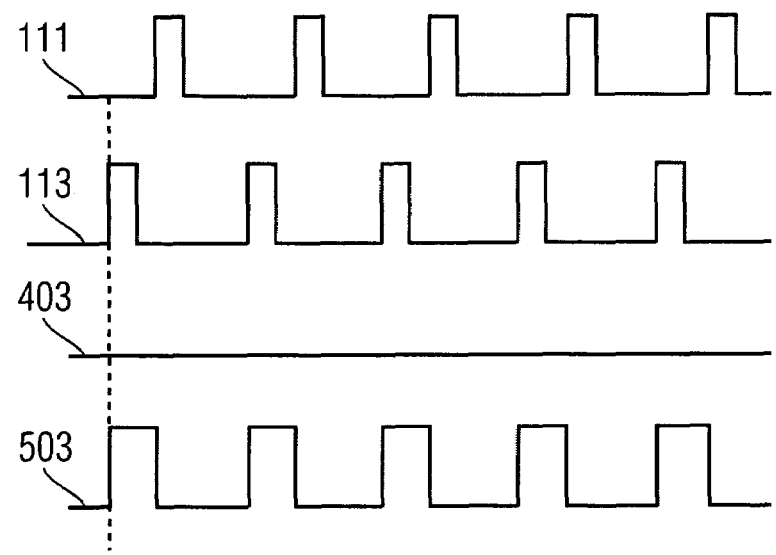
FIG. 6 illustrates the prior-art false locking problem of the DLL of FIG. 1.

FIG. 5 shows the effect of the present invention when the lock_to_zero_o signal 211 goes to high (indicating that Vloop 117 has increased too much). In response to the lock_to_zero_o signal 211 going to high, the pulse swallower 207 removes a pulse from the reference clock signal 111. By removing the pulse, the fed-back output clock signal 113 appears to lead the reference clock signal 111 and the direction of the PFD 103 up signal 403 is reversed to become a PFD 103 down signal 503 having a width from a leading edge of the reference clock signal 111 to a leading edge of the output clock signal 113. Thus, the Vloop 117 is decreased to increase the delay and prevent the DLL 201 from becoming stuck.

The pulse swallower 207 also functions to remove a pulse from the output clock signal 113 if the false_lock_o signal 215 goes high (indicating that the DLL 101 is locked to a false phase). By doing so, the direction of the PFD 103 output is reversed from a down signal to an up signal to increase the delay of the VCDL 109.

Figure 7:
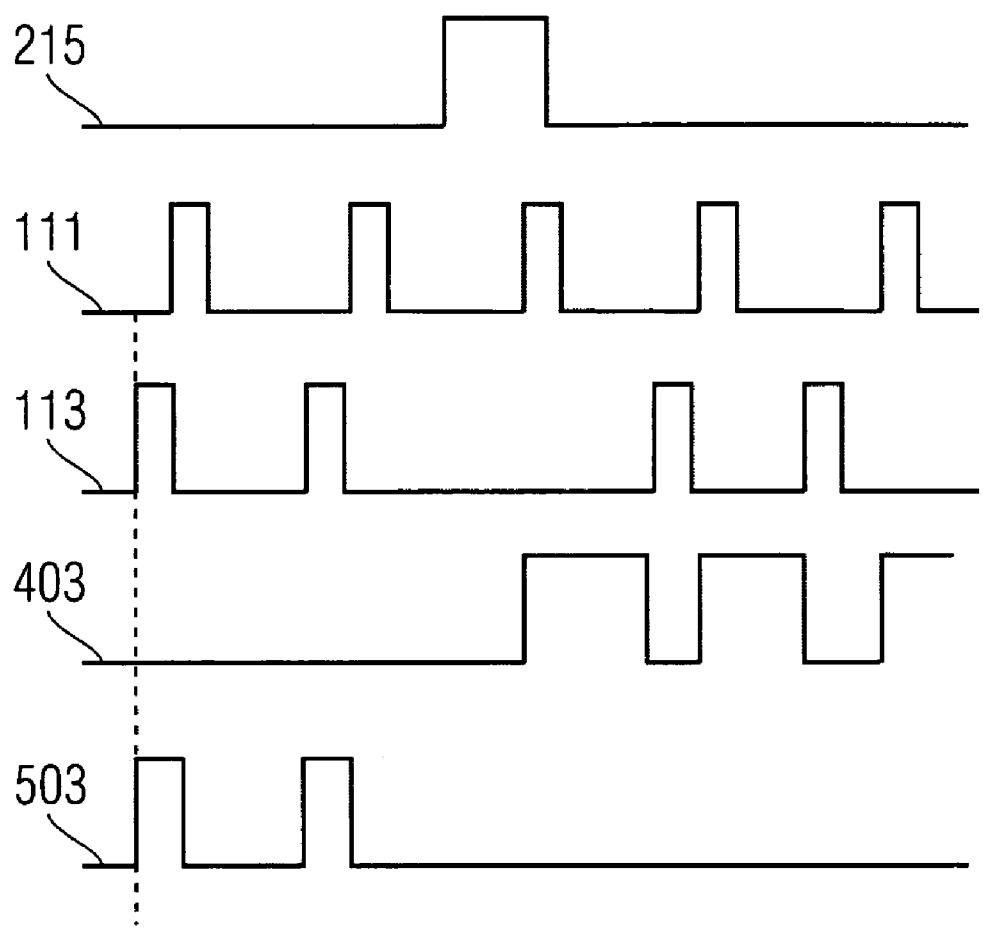
FIG. 7 illustrates the false locking problem solved by the invention of FIG. 2.

FIG. 7 shows the effect of the present invention when the false_lock_o signal 215 goes to high. In response to the false_lock_o signal 215 going to high, the pulse swallower 207 removes a pulse from the fed-back output clock signal 113. By removing the pulse, the direction of the PFD 103 down signal 503 is reversed to become a PFD 103 up signal 403 having a width from a leading edge of the output clock signal 113 to a leading edge of the reference clock signal 111. Thus, the Vloop 117 is increased to decrease the delay of the DLL 201 to prevent locking on the wrong phase.

With the help of these circuits 203, 205 and 207, the DLL 201 initial condition can be set at any point. Also, the reference clock signal can be changed without resetting the DLL 201.

The present invention may be embodied in other forms without departing from its spirit and scope. The embodiments described above are therefore illustrative and not restrictive, since the scope of the invention is determined by the appended claims rather then by the foregoing description, and all changes that fall within the meaning and range of equivalency of the claims are to be embraced within their scope.

What is claimed is:

1. A delay locked loop (DLL) comprising:
   a delay unit configured to delay an input clock signal by a specified amount to produce a delayed clock signal;
   a phase detector for receiving as input the input clock signal and the delayed clock signal and for outputting a control signal proportional to the phase difference between the input clock signal and the delayed clock signal to adjust the delay to the specified amount; and
   a pulse swallower for removing a pulse from the input clock signal or from the delayed clock signal to reverse a direction of the control signal.

2. The DLL of claim 1, wherein the pulse is removed from the input clock signal to prevent DLL from attempting to lock the delayed clock signal to zero.

3. The DLL of claim 1, wherein the pulse is removed from the delayed clock signal to prevent a false lock.

4. The DLL of claim 1, wherein the DLL does not need to be reset to prevent a false lock.

5. The DLL of claim 1, wherein the delay unit includes a voltage controlled delay line.

6. The DLL of claim 5, wherein the control signal is output to a charge pump and a loop capacitor for adjusting a voltage provided to the voltage controlled delay line.

7. The DLL of claim 1, wherein the pulse is removed from the input clock signal and the direction of the control signal is reversed from an up signal to a down signal having a width from a leading edge of the input clock signal to a leading edge of the output clock signal.

8. The DLL of claim 1, wherein the pulse is removed from the input clock signal and the direction of the control signal is reversed from an up signal to a down signal having a width from a leading edge of the output clock signal to a leading edge of the input clock signal.

9. The DLL of claim 1, wherein the pulse is removed from the input clock signal and the direction of the control signal is reversed from a down signal to an up signal having a width from a leading edge of the input clock signal to a leading edge of the output clock signal.

10. The DLL of claim 1, wherein the pulse is removed from the input clock signal and the direction of the control signal is reversed from a down signal to an up signal having a width from a leading edge of the output clock signal to a leading edge of the input clock signal.

11. A delay lock loop (DLL) comprising:
a phase detector having a first input and a second input;
a charge pump with an input coupled to an output of the phase detector;
a loop filter with an input coupled to an output of the charge pump;
a variable delay with a first input coupled to an output of the loop filter, the variable delay further including a second input coupled to a clock node;
a pulse swallower with an input coupled to an output of the variable delay, the pulse swallower further including a first output coupled to the first input of the phase detector and a second output coupled to the second input of the phase detector; and
a lock to zero detector coupled between the loop filter and the pulse swallower.

12. The DLL of claim 11, further comprising a false lock detector coupled between the variable delay and the pulse swallower.

13. The DLL of claim 11, wherein the lock to zero detector comprises a comparator.

14. The DLL of claim 11, wherein the loop filter comprises a loop capacitor.

15. A method of generating a clock signal, the method comprising:
providing an input clock signal;
delaying the input clock signal by a specified amount to produce a delayed clock signal;
detecting a phase difference between the input clock signal and the delayed clock signal;
generating a control signal proportional to the phase difference between the input clock signal and the delayed clock signal;
adjusting an amount of delay in the delaying step based upon the control signal; and
removing a pulse from the input clock signal or from the delayed clock signal to reverse a direction of the control signal.

16. The method of claim 15, further comprising changing a frequency of the input clock signal, wherein a delay of the delay clock signal can be locked to a delay of the input clock signal without use of a reset operation.

17. The method of claim 15, wherein the pulse is removed from the input clock signal and the direction of the control signal is reversed from an up signal to a down signal having a width from a leading edge of the input clock signal to a leading edge of the delayed clock signal.

18. The method of claim 15, wherein the pulse is removed from the input clock signal and the direction of the control signal is reversed from an up signal to a down signal having a width from a leading edge of the delayed clock signal to a leading edge of the input clock signal.

19. The method of claim 15, wherein the pulse is removed from the input clock signal and the direction of the control signal is reversed from a down signal to an up signal having a width from a leading edge of the input clock signal to a leading edge of the delayed clock signal.

20. The DLL of claim 15, wherein the pulse is removed from the input clock signal and the direction of the control signal is reversed from a down signal to an up signal having a width from a leading edge of the delayed clock signal to a leading edge of the input clock signal.

* * * * *